United States Patent [19]
Bronner et al.

[11] Patent Number: 5,937,289
[45] Date of Patent: Aug. 10, 1999

[54] PROVIDING DUAL WORK FUNCTION DOPING

[75] Inventors: Gary Bela Bronner, Stormville, N.Y.; Jeffrey P. Gambino, Gaylordsville, Conn.; Jack A. Mandelman, Stormville; Carl J. Radens, Poughkeepsie, both of N.Y.; William Robert Tonti, Essex Junction, Vt.

[73] Assignee: International Business Machines Corporation, Armonk, N.Y.

[21] Appl. No.: 09/003,106

[22] Filed: Jan. 6, 1998

[51] Int. Cl.⁶ .............................. H01L 21/8238
[52] U.S. Cl. .................. 438/233; 438/231; 438/525; 438/556; 438/563
[58] Field of Search ............... 438/229, 230, 438/231, 232, 302, 563, 555, 556, 565, 233, 525

[56] References Cited

U.S. PATENT DOCUMENTS

| | | | |
|---|---|---|---|
| 4,201,603 | 5/1980 | Scott et al. | 438/555 |
| 4,599,789 | 7/1986 | Gasner | 438/231 |
| 5,028,564 | 7/1991 | Chang et al. | 438/563 |
| 5,308,780 | 5/1994 | Bhou et al. | 437/44 |
| 5,355,006 | 10/1994 | Iguchi | 257/296 |
| 5,360,751 | 11/1994 | Lee | 438/302 |
| 5,378,641 | 1/1995 | Cheffengs | 437/35 |
| 5,500,379 | 3/1996 | Odake et al. | 437/34 |
| 5,576,579 | 11/1996 | Agnello et al. | 257/751 |
| 5,614,432 | 3/1997 | Goto | 437/56 |
| 5,770,490 | 6/1998 | Frenete et al. | 438/168 |

*Primary Examiner*—Michael Trinh
*Attorney, Agent, or Firm*—Pollock, Vande Sande & Amernick; Steven Capella

[57] ABSTRACT

Dual work function doping is provided by doping a selected number of gate structures having self-aligned insulating layer on top of the structures through at least one side wall of the gate structures with a first conductivity type to thereby provide an array of gate structures whereby some are doped with the first conductivity type and others of the gate structures are doped with a second and different conductivity type. Also provided is an array of gate structures whereby the individual gate structures contain self-aligned insulating layer on their top portion and wherein some of the gate structures are doped with a first conductivity type and other of the gate structures are doped with a second and different conductivity type.

17 Claims, 3 Drawing Sheets

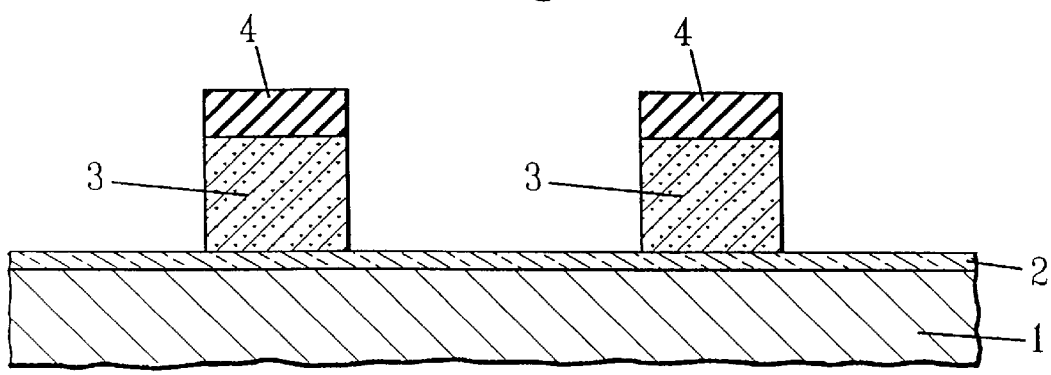
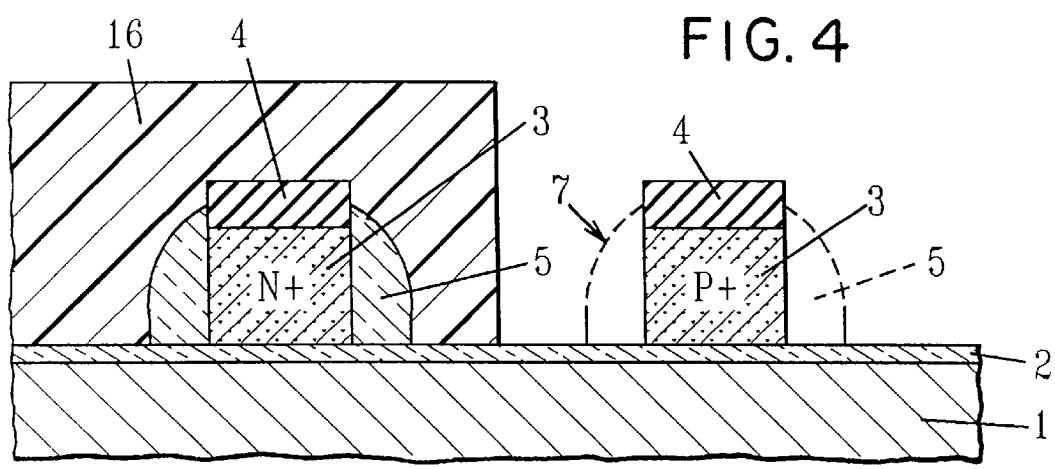
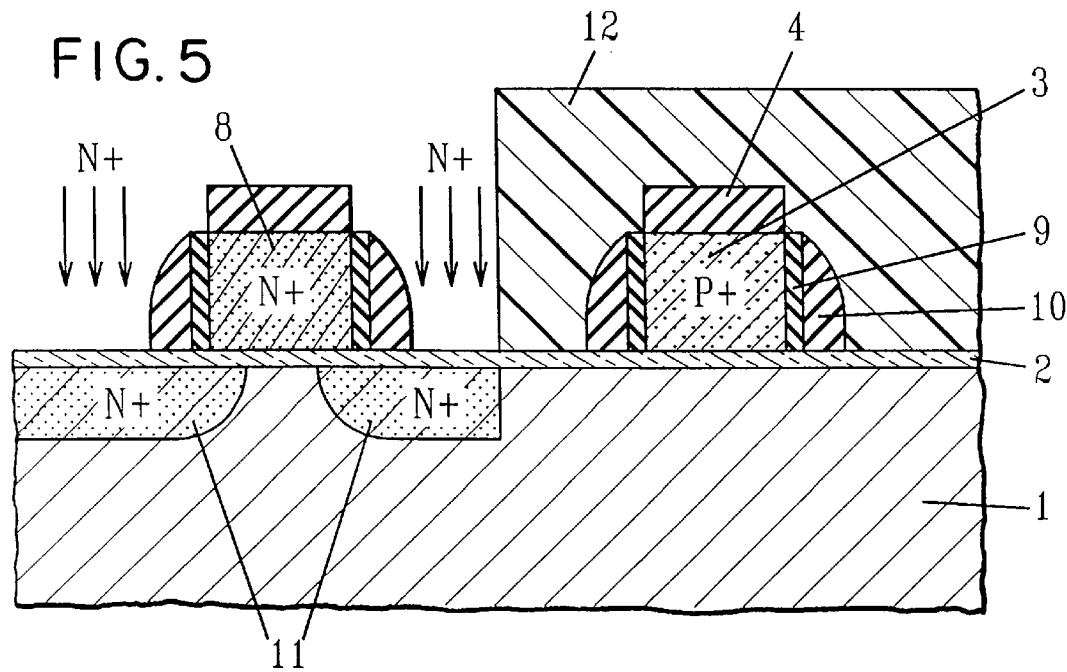

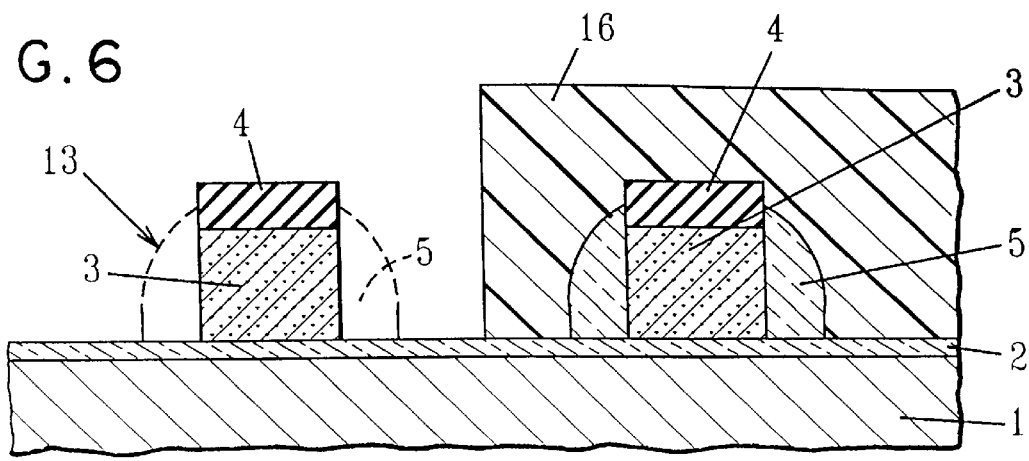
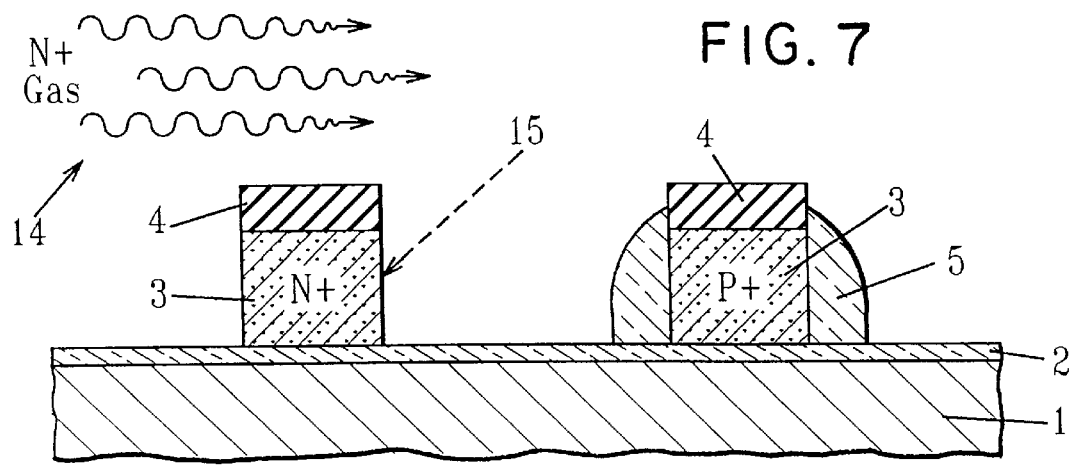
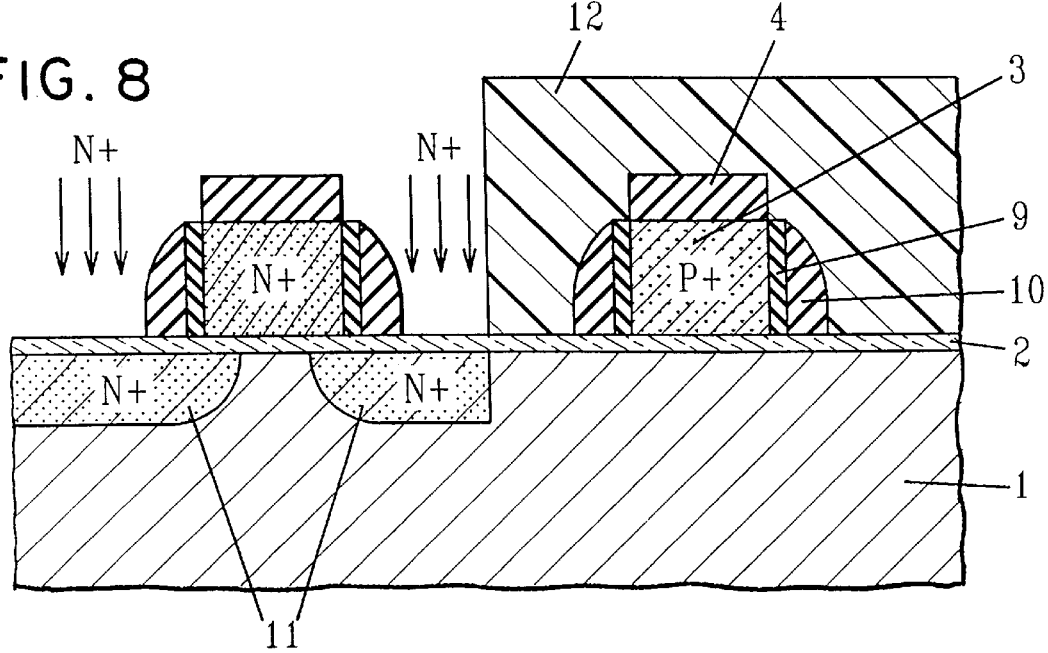

PROVIDING DUAL WORK FUNCTION DOPING

TECHNICAL FIELD

The present invention is concerned with a process for providing dual work function doping, and more particularly is concerned with providing an array of gate structures whereby some of the gate structures are P+ doped and other of the gate structures are N+ doped. The present invention is especially advantageous for providing structures that include both DRAMs and logic circuits. The present invention is especially advantageous for providing the necessary doping for gate structures that are capped with a self-aligned insulating layer to provide for borderless contact.

BACKGROUND OF THE INVENTION

Over the last several years, significant advances have occurred in increasing the circuit density in integrated circuit chip technology. The ability to provide significantly increased numbers of devices and circuits on an integrated circuit chip has, in turn, created an increased desire to incorporate or integrate additional system functions onto a single integrated circuit chip. In particular, an increasing need exists for joining both memory circuits and logic circuits together on the same integrated circuit chip.

In fabricating dynamic random access memory (DRAM) circuits, the emphasis has been on circuit density along with reduced cost. On the other hand, when fabricating logic circuits, the emphasis is on creating circuits that operate faster. Accordingly, this desire for dual work function creates additional problems with respect to the complexity and relative cost of the fabricating process. For instance, memory circuits achieve increased density requirements by employing self-aligned contacts (borderless bit line contacts), which are easily implemented in a process having a single type, e.g. typically N+ type, gate work function. A buried-channel type PMOSFET is used in creating DRAMs since such permits a single work function gate conductor, N+, to be used throughout the fabrication process. This results in significant cost savings in fabricating DRAMs, but at the expense of creating an inferior performing PMOSFET. On the other hand, logic circuits require both P+ and N+ gated MOSFETs in order to achieve the necessary switching speeds. P+ and N+ gate conductor devices are highly desirable for merged logic and DRAM (MLD) products.

A typical method for obtaining memory arrays having high density along with borderless bit line contacts (borderless to adjacent gate conductor) involves using a gate cap such as a silicon nitride on top of the gate conductor (e.g. polysilicon or composite polysilicon/silicide) for providing protection against bit line to gate conductor shorts when the contact opening is created. For instance, see FIG. 1 wherein numeral 1 is the silicon substrate, 2 represents the gate insulator, 3 the polysilicon gate, 4 the silicon nitride cap, 5 the side wall insulation such as silicon dioxide or silicon nitride and 6 the contact opening.

Even with misalignment as illustrated by the dashed lines in FIG. 1, the gate is protected by a combination of the nitride gate cap and the side wall spacers.

On the other hand, as illustrated in FIG. 2, the logic fabricating process employs gate structures that do not include a cap so that the particular desired gate, P+ or N+, can be created by ion-implanting the necessary dopant from above the gate. The presence of a nitride cap would block off the ion implantation and frustrate or prevent the necessary doping requirement. This is contrary to the fabricating requirements for achieving memory device density which necessitate the presence of a cap on the gate.

SUMMARY OF INVENTION

An object of the present invention is to achieve the dual work function requirement for selectively applying either P+ and N+ doping to the gate conductor while at the same time creating a self-aligned cap on the gate conductor.

In particular, the present invention is concerned with a process for providing dual work function doping. The process of the present invention includes providing a semiconductor substrate and forming a first insulating layer over the semiconductor substrate; followed by depositing a gate conductor on the insulating layer. A second insulating layer is deposited on the gate conductor and the second insulating layer and gate conductor are delineated to form gate structures with the second insulating layer self-aligned on the top of the gate structures. Then, a selected number of the gate structures, less than all of the gate structures, is doped through at least one side wall of the gate structures with a first conductivity type dopant to thereby provide an array of gate structures whereby some of the gate structures are doped with the first conductivity type and other of the gate structures are doped with a second and different conductivity type.

In addition, the present invention is concerned with an array of doped gate structures obtained by the above-described process. Moreover, the present invention is concerned with an array of gate structures exhibiting dual work function doping wherein said gate structure comprises self-aligned insulating layer on the top of the gate structures; and wherein some of the gate structures are doped with a dopant of a first conductivity type and other of the gate structures are doped with a second and different conductivity type.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF THE DRAWINGS

FIGS. 3–5 are schematic diagrams of a device in various stages of fabrication according to the present invention.

FIGS. 6–8 are schematic diagrams of a device produced according to an alternative technique according to the present invention.

BEST AND VARIOUS MODES FOR CARRYING OUT INVENTION

Figure 1:
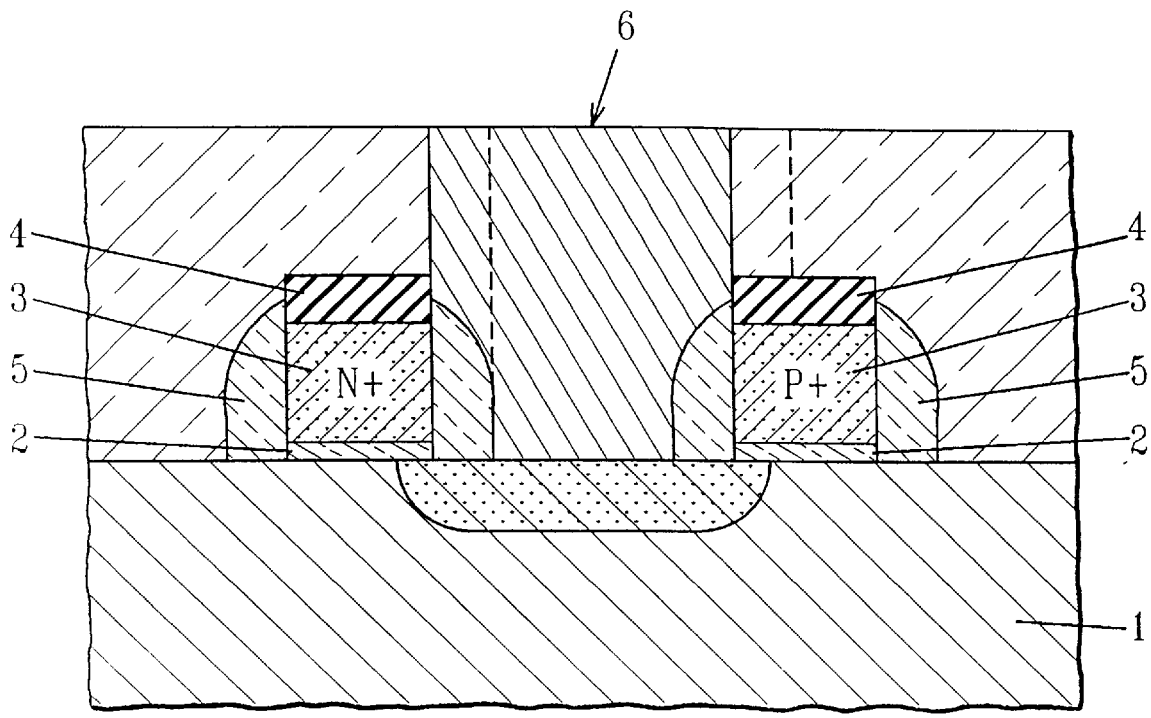
FIG. 1 is a schematic diagram of prior art memory array.
Figure 2:
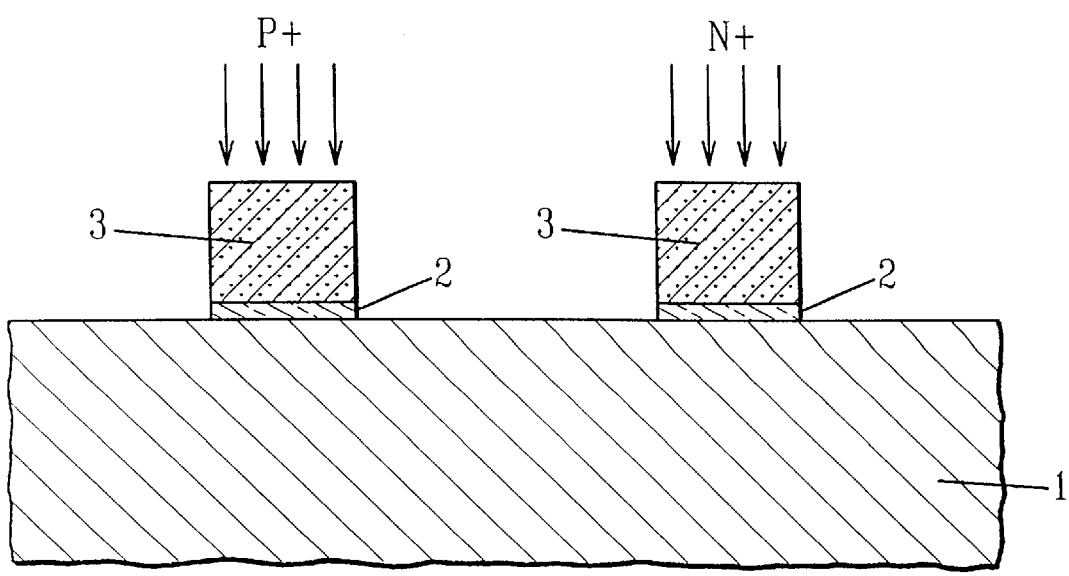
FIG. 2 is a schematic diagram of prior art gate structure for logic circuit.

In order to facilitate an understanding of the present invention, reference will be made to the figures which illustrate a diagrammatic representation of the fabrication steps employed according to the present invention.

It is understood that when reference is made to a dopant or impurities of a "first type" and to impurities or dopant of the "second type", it is understood that the "first type" refers to N- or P-type. Moreover, the terms "polysilicon" and "polycrystalline silicon" are used interchangeably as in the prior art. It is further understood that when the discussion refers to N-type dopants, the process steps are applicable to P-type dopants, and vice versa.

According to the present invention, a semiconductor substrate 1 is provided (see FIG. 3). The semiconductor substrate 1 is typically silicon but can be any semiconductor material such as group II–VI semiconductors, group III–V semiconductors, a composite silicon semiconductor such as silicon carbide.

A first insulating layer 2 is formed over the substrate 1. The first insulating layer can be for example silicon dioxide, silicon nitride and/or silicon oxynitride and can be provided by deposition technique such as chemical vapor deposition (CVD) or physical vapor deposition (PVD) or by thermal oxidation or nitridation of the underlying silicon substrate or by nitridation of an oxide layer. Typically, this layer is about 30 to about 120 Å thick, and more typically about 40 to about 100 Å thick, and acts as a gate insulator.

A conductive gate material 3 such as a N+ or P+ doped polycrystalline silicon layer or doped polysilicon/silicide is provided on the first insulating layer 2. The conductive layer 3 is to provide the subsequently to be delineated gate conductor. Typically, the conductive layer 3 is about 300 to about 1500 Å thick, and more typically about 500 to about 1000 Å thick.

Suitable P-type dopants for silicon are boron, aluminum, gallium and indium. The preferred P-type dopant is boron. Typically, the level of doping is at least about $10^{20}$ atoms of dopant/$cm^3$.

Next, a second insulating layer 4 is formed on gate layer material 3. Examples of suitable insulating layer 4 materials are silicon nitride, silicon dioxide, silicon oxynitride and boron nitride. A preferred insulating layer 4 is silicon nitride. Typically, this second insulating layer 4 is formed by chemical vapor deposition or physical vapor deposition. Typically, this second insulating layer 4 is about 300 to about 2500 Å thick, and more typically about 500 to about 2000 Å thick.

A gate pattern determining layer, such as a layer of resist material (not shown) of the type employed in known lithographic masking and etching techniques is placed over the surface of the second insulating layer 4. Any of the well-known photosensitive polymerizable resist materials known in the art may be used. The resist material is applied such as by spinning or by spraying.

The layer of photoresist material is dried and then selectively exposed to electromagnetic radiation such as ultraviolet light radiation using a photolithographic mask. After the lithographic mask is removed, the photoresist material is developed by dissolving in a suitable developing solution or by reactive ion etching to thereby remove selected portions of the resist. Next, the structure is etched by RIE to remove the portions of the second insulating layer 4 not protected by the resist material followed by removal of the underlying gate conductor material 3 exposed upon removal of the second insulating layer 4. This results in patterned gates having self-aligned caps on top of the gates, as illustrated in FIG. 3.

Next, silicate glass spacers 5 are formed on the side walls of gates 3 (see FIG. 4). The silicate glass spacers are doped with a dopant of the opposite conductivity type as the dopant of the gates. In this example, since the gates are doped with a P-type dopant, the silicate glass is doped with a N-type dopant such as phosphorus, arsenic and/or antimony. The preferred dopant is phosphorus. The concentration of phosphorus in the silicate glass preferably is above the solid solubility point in silicon so as to provide as much N-type dopant as possible. The concentration of dopant in the silicate glass must be high enough to counter dope the polysilicon. In the case of N+ polysilicon gates, the silicate glass will be doped with a P-type dopant such as boron. However, in the case of boron, somewhat greater control of the subsequent processing steps should be observed in order to guaranty that such will not penetrate through the underlying insulating layer 2.

Next, a photoresist 6 is patterned over the devices which are intended to be counterdoped to the dopant of the second and opposite type. In the case where the polysilicon gate material is P-type, then the photoresist is patterned over the devices which are intended to be N+ type. The doped silicate glass is then removed from the intended PFET devices, as shown in FIG. 4 by dotted lines 7.

In an alternative fabrication process scheme, the doped silicate spacers can be selectively applied to the desired gate structures by applying a global silicon oxide layer which is selectively patterned to expose the gate devices upon which the doped silicate glass spacers are to be formed. Then, the global oxide, if desired, can be removed.

In any event, the dopant from the silicate glass will then be absorbed and distributed throughout the gate polysilicon from the side walls. Since the dopant diffusivity in polysilicon is about 100 times larger than in single crystal silicon, the doping will readily distribute throughout the gate polysilicon. The diffusion process is preferably enhanced and accelerated by subjecting the device to a thermal process such as temperatures of about 800 to about 1100° C. Such techniques include a furnace anneal or rapid thermal processing (RTP). The elevated temperatures electrically activate the dopant, improve the diffusion uniformity and drive in the dopant from for example the PSG to thereby counterdope the P+ doped polysilicon gate 8 thereby yielding an N+ gate MOSFET.

Next, the doped silicate glass is removed and the device is subjected to subsequent normal processing steps (see FIG. 5).

In particular, gate side wall insulation 9 such as oxide can be formed followed by nitride gate side wall spacer 10. In addition, a photoresist 12 can be applied so as to pattern the various gates of different types for source-drain implants 11.

FIGS. 6–8 illustrate an alternative technique for fabricating the devices of the present invention. In particular, boron silicate glass spacers 5 are formed on the undoped or intrinsically doped polysilicon. Intrinsically doped polysilicon contains minor amounts of background doping of less than $5 \times 10c^{15}$ atoms/$cm^3$. A photoresist 6 is patterned over the devices which are intended to be P+ type. The boron silicate glass is then removed from the devices 13 that are intended to be N+ gates.

Next (see FIG. 7), either gas phase doping 14 with a N+ gas such as arsine or phosphine or an angle ion implant 15 of for instance arsenic, phosphorus or antimony is used to dope the N+ gates. The gate polysilicon absorbs the N+ dopants on its side and since the dopant diffusivity in the polysilicon is approximately 100 times larger than that in single crystal silicon, the N+ doping will be readily distributed throughout the gate polysilicon. Next, a thermal cycle is employed to electrically activate both dopants to improve their diffusion uniformity and to drive in the boron from the boronated silicon glass thereby fabricating the P+ doped polysilicon gate structures.

After the remaining doped silicate glass is stripped, the subsequent processing step can be carried out. For instance, gate side wall oxide 9 can be formed followed by nitride gate side wall spacers 10. In addition, a photoresist 12 is patterned in order to provide the selective source-drain implants 11 for the gate structures. Typically, the N+ gates will be provided with N+ implants for source and drain regions and the P+ gates will be provided with P+ implants for the respective source and drain regions. However, P+ source/drain implants can be provided with N+ gate and N+ source/drain implants can be provided with P+ gate, if desired. This enhances the variety of device types available.

Of course, it is understood that in this alternative procedure the N+ gates can be fabricated employing a N-doped silicate glass such as phosphorous silicate glass and ion implanting a P-type dopant such as B or using gas phase dopant such as $B_2H_6$ for the PFET gates.

The thermal cycling is also beneficial since it tends to desorb any hydrogen that may have been incorporated in the structure due to the depositing of the silicon nitride by LPCVD deposition process. This in turn reduces the likelihood of boron from penetrating through the gate oxide layer.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A process for providing dual work function doping which comprises:

providing a semiconductor substrate;

providing a first insulating layer over said semiconductor substrate;

depositing a gate conductor on said insulating layer;

depositing a second insulating layer on said gate conductor;

delineating said second insulating layer and said gate conductor to form gate structures with said second insulating layer self-aligned on the top of said gate structure;

then doping a selected number of gate structures, less than all of said gate structures, through at least one side wall of said selected number of said gate structures, with a first conductivity type to provide an array of gate structures whereby some of said gate structures are doped with said first conductivity type and other of said gate structures are doped with a second and different conductivity type.

2. The process of claim 1 wherein said step of depositing a gate conductor comprises depositing a P-doped polysilicon gate conductor.

3. The process of claim 2 wherein said step of doping a selected number of gate structures comprises providing a N-type doped silicate glass on side walls of those gates that are to be N-type gates followed by causing said N-dopant from said silicate glass to diffuse into said polysilicon.

4. The process of claim 3 wherein said doped silicate glass is phosphorus silicate glass.

5. The process of claim 3 which further includes removing the silicate glass from said side walls after said doping.

6. The process of claim 3 which further includes providing gate oxide side walls, nitride gate side wall spacers after said doping and providing source and drain selected implants.

7. The process of claim 3 wherein said second insulating layer is selected from the group consisting of silicon nitride, silicon dioxide, silicon oxynitride, and boron nitride.

8. The process of claim 3 wherein said second insulating layer is silicon nitride.

9. The process of claim 1 wherein said doping a selected number of gate structures comprises angle ion implantation.

10. The process of claim 1 wherein said doping said selected number of gate structures comprises subjecting said gate structures to a gas containing said dopant.

11. The process of claim 10 wherein said gas is arsine, phosphine or diborane.

12. The process of claim 1 wherein said second insulating layer is from a material selected from the group consisting of silicon nitride, silicon dioxide, silicon oxynitride and boron nitride.

13. The process of claim 1 wherein said second insulating layer is silicon nitride.

14. The process of claim 1 wherein said first insulating layer is selected from the group consisting of silicon dioxide, silicon nitride and silicon oxynitride.

15. The process of claim 1 wherein said first insulating layer is silicon dioxide.

16. The process of claim 13 wherein said first insulating layer is silicon dioxide.

17. The process of claim 1 wherein the selected number of gate structures are doped with said first conductivity type distributed throughout said gate structures.

* * * * *